Figure 1:
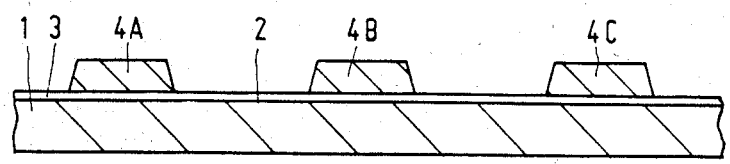

United States Patent [19]

Peek

[11] Patent Number: 4,700,459
[45] Date of Patent: Oct. 20, 1987

[54] METHOD OF MANUFACTURING A SEMICONDUCTOR DEVICE WITH OVERLAPPING STRIP ELECTRODES

[75] Inventor: Hermanus L. Peek, Eindhoven, Netherlands

[73] Assignee: U.S. Philips Corporation, New York, N.Y.

[21] Appl. No.: 905,225

[22] Filed: Sep. 8, 1986

[30] Foreign Application Priority Data

Sep. 11, 1985 [NL] Netherlands .................... 8502478

[51] Int. Cl.$^4$ .................... H01L 27/00; H01L 31/00; H01L 29/78
[52] U.S. Cl. .................................... 437/53; 357/24; 437/228; 437/233; 437/235; 437/239
[58] Field of Search ............... 357/23.15, 54, 24 M, 357/24; 29/580, 571, 590, 591; 148/1.5

[56] References Cited

U.S. PATENT DOCUMENTS

| | | | |
|---|---|---|---|
| 3,909,925 | 10/1975 | Forbes | 29/578 |
| 4,077,112 | 3/1978 | Theunissen | 29/580 |
| 4,280,068 | 7/1981 | Snijder | 307/221 |
| 4,332,078 | 6/1982 | Peek | 29/580 |

OTHER PUBLICATIONS

*IEEE Trans. on Electron Devices*, vol. ED-21, No. 12, pp. 758-767, by W. J. Bertram "A Three-Level Metallization Three-Phase CCD".
*IEEE Trans. on Electron Devices*, vol. ED-21, No. 11, pp. 712-720, by C. H. Sequin et al, "Charge-Couple Area Image Sensor Using Three Levels of Polysilicon". *Physics of Semiconductor Devices*, by S. M. Sze, John Wiley & Sons, pp. 412-415.

*Primary Examiner*—Brian E. Hearn
*Assistant Examiner*—Chi-Tso Huang
*Attorney, Agent, or Firm*—Paul R. Miller

[57] ABSTRACT

A method is set forth of manufacturing a three-layer electrode system, more particularly for use in CCD image sensors. A group of first electrodes (4A,B,C) is formed on a gate oxide layer (3) by a first silicon layer (4). After etching away the exposed gate oxide, a first thermal oxidation is carried out. Subsequently, an anti-oxidation layer (6) of, for example, silicon nitride is provided, on which a second silicon layer (7) is provided, from which a group of second electrodes (7A,B) is formed. The second electrode overlap the first electrodes in part, whereupon they are subjected to a second thermal oxidation. The exposed part of the anti-oxidation layer (6) is removed by anisotropic plasma etching which maintains parts (6A) on the edge of the first electrodes and under projecting oxide edges. After a third thermal oxidation, a third silicon layer (9) is provided, from which a third group of electrodes (9A,B) is formed, which partially overlap first and second electrodes. The thermal oxidations are carried out in such a manner that the dielectric thickness is the same under all electrodes.

6 Claims, 10 Drawing Figures

METHOD OF MANUFACTURING A SEMICONDUCTOR DEVICE WITH OVERLAPPING STRIP ELECTRODES

The invention relates to a method of manufacturing a semiconductor device comprising mutually insulated silicon electrodes overlapping each other, in which the surface of a silicon region is provided with an electrically insulating layer comprising a first oxide layer and having a homogeneous dielectric thickness, while there is formed on this insulating layer a first silicon layer from which a number of strip-shaped first electrodes are formed by etching, after which the exposed parts of the insulating layer are removed and then a first thermal oxidation is carried out for forming a second oxide layer on the first electrodes and the exposed silicon region, whereupon the entire structure is covered with an electrically insulating anti-oxidation layer and subsequently a second silicon layer is deposited, from which a number of strip-shaped second electrodes are formed by etching with the second electrodes each being located between two first electrodes and overlapping them in part, and the overall dielectric thickness being practically the same under the first and under the second electrodes.

Such a method is known from U.S. Pat. No. 4,332,078.

Semiconductor devices comprising mutually insulated electrodes overlapping each other in part are of frequent occurrence in the semiconductor technology, more particularly, although not exclusively, in field effect devices, in which overlapping gate electrodes are provided on an insulating layer. One of the most important applications of such electrode structures can be found in so-called charge-coupled devices designated as CCD's ("Charge-Coupled Devices").

In such CCD's, which are used in memories and image sensors, an electrode structure is often required consisting of three groups of first, second and third electrodes, respectively, with the first, second and third electrodes being located beside each other and overlapping each other in part. The electrodes of each group are formed together with the associated interconnection pattern from a separate silicon layer, while the electrodes are mutually insulated by thermal oxide layers grown on them.

The simplest and most obvious method of manufacturing such a three-layer electrode structure comprises the steps of providing on a silicon body an oxide layer (the "gate oxide"), providing a first silicon layer, forming a group of first electrodes from the first silicon layer, removing the parts of the gate oxide located between the first electrodes, thermally oxidizing the first electrodes and the interposed silicon, providing a second silicon layer, forming a group of second electrodes from the second silicon layer, etching away the interposed oxide present on the silicon body, thermally oxidizing the second electrodes and the interposed silicon, providing a third silicon layer and forming a group of third electrodes from the third silicon layer.

However, such a method has a number of important disadvantages. These disadvantages are connected with the requirement that the threshold voltage, i.e. the voltage between an electrode and the subjacent silicon region in which an inversion layer is formed at the surface, has to be practically the same for all electrodes. Since in the method described above, due to this requirement the oxidation conditions during the oxidation of the first and of the second electrodes cannot be freely chosen, but are determined by the required dielectric thickness under the electrodes, the oxide thickness and the oxide quality on the electrodes often cannot be optimum.

A further important disadvantage of the circumstance that the oxide layer on the electrodes cannot be chosen arbitrarily thick is that, when this oxide layer is thin, during the step of shaping the first and second electrodes by etching, cavities are formed at the foot of the first and second electrodes, in which cavities silicon wires are left which may give rise to short-circuits.

In the aforementioned U.S. Pat. No. 4,332,078 an improved method is described in which the latter disadvantage is eliminated. In this case, the cavities formed after the steps of shaping by etching and of oxidizing the first electrodes at the foot of these electrodes are filled with material by providing and subsequently etching away an insulating auxiliary layer with the cavities remaining filled with material of the auxiliary layer.

However, this method has the disadvantage that an additional auxiliary layer has to be provided and etched away, while also the aforementioned disadvantage that the oxidation of the first and second electrodes cannot be freely chosen not is eliminated.

The invention has for its object to provide a method in which without the auxiliary layers a three-layer electrode structure with an optimum mutual insulation of the electrodes overlapping each other can be obtained.

The invention is based on recognition of the fact that this can be achieved at suitable stages of the process by an insulating anti-oxidation layer and an anisotropic plasma etching process.

According to the invention, a method of the kind described in the opening paragraph is characterized in that between two adjacent second electrodes there are located at least two first electrodes, in that a second thermal oxidation is carried out for forming a third oxide layer on the second electrodes, after which the exposed part of the anti-oxidation layer and a part of the second and third oxide layers are removed by anisotropic plasma etching except for the parts of the anti-oxidation layer located on the edge of the first electrodes and under projecting parts of the second and third oxide layers, in that during a third thermal oxidation the exposed second oxide layer on the silicon region obtains practically the same dielectric thickness as that under the first and second electrodes, and in that then a third silicon layer is provided from which a number of strip-shaped third electrodes are formed with the third electrodes each being located between two first electrodes and overlapping them, and at least one third electrode also overlapping a second electrode.

The anti-oxidation layer for which in most cases a silicon nitride layer or a layer containing silicon nitride such as, for example, a silicon oxynitride layer will be used, although other layers, for example, aluminium oxide, are also possible, is the only "additional" layers used in the method according to the invention. Thus, various advantages are obtained. In the first place, the oxide on the first electrodes (of which the thickness cannot be freely chosen because it is determinative of the dielectric thickness under the first electrodes) is strengthened by the overlying anti-oxidation layer, which improves the quality of the insulation between the first and third electrodes. Futhermore, due to the presence of the anti-oxidation layer, the oxide thickness on the second electrodes can indeed be freely chosen, while during anisotropic plasma etching, the insulation at the edge of the first electrodes is strengthened and cavities present in situ are automatically filled. Finally, during the third thermal oxidation, the anti-oxidation layer is pressed against the lower side of the oxide on the edge of the second electrodes, as a result of which the insulation thickness in lateral direction between the second and third electrodes is at least equal to the thickness of the third oxide layer formed on the second electrodes, which is of particular importance in the case of very narrow "first" electrodes ($\leq 3$ μm), in which event overlap between the second and third electrodes is often inevitable.

The insulating layer provided in the first instance on the silicon body may be a homogeneous layer or a layer composed of one or more layers of different materials. Mostly, however, this layer will entirely consist of silicon oxide thermally grown or provided in a different manner, which is the simplest solution also in connection with the required etching steps.

Also electrodes, interconnections and other wiring parts may be formed simultaneously during etching from a silicon layer, while it is simplest when the doping of the conductor tracks to be formed takes place before patterning by etching.

Figure 9:
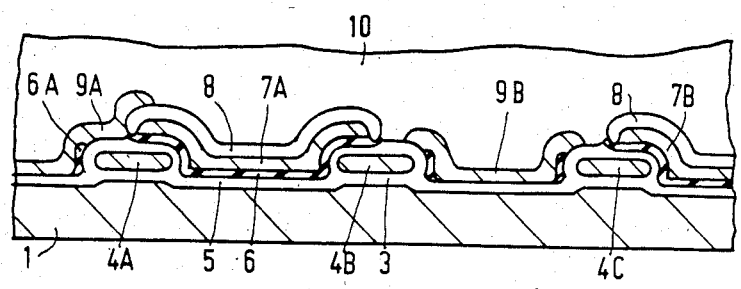
Figure 10:
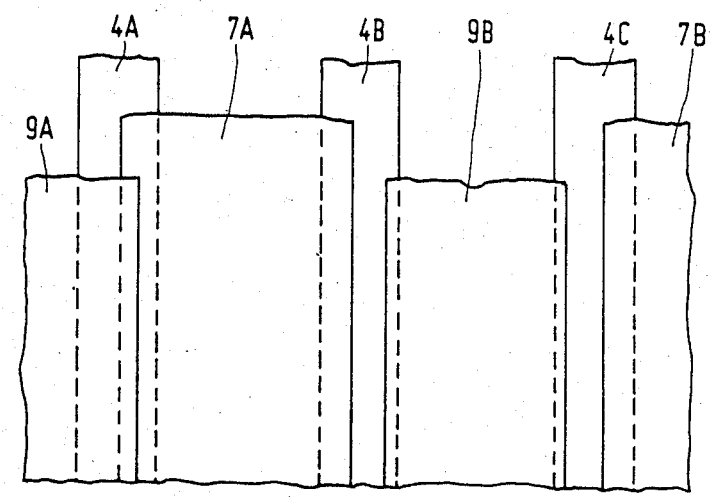

The invention will now be described more fully with reference to an embodiment and the drawing, in which:

FIGS. 1 to 9 show diagrammatically in cross-section successive stages of the manufacture of a semiconductor device by means of the method according to the invention, and FIG. 10 shows diagrammatically in plan view the electrode pattern obtained.

In the Figures, corresponding parts are generally designated by the same reference numerals. The Figures are not drawn to scale and the sake of clarity the dimensions in the direction of thickness are proportionally greatly exaggerated. In the embodiment shown in FIGS. 1 to 10 the manufacture of a semiconductor device, in this case a charge-coupled device (CCD), is shown having overlapping and mutually insulated strip-shaped electrodes, used in this case as gate electrodes, which are represented in FIG. 9 in cross-section and in FIG. 10 in plan view.

Starting material is a silicon region 1 (cf. FIG. 1) of, for example, the n conductivity type having a doping of, for example, $5 \times 10^{14}$ atoms per $cm^3$. This region 1 may be a homogeneously doped silicon body, but may also be an epitaxial layer deposited on a substrate having different conductivity properties.

The surface 2 of the region 1 is provided in this embodiment by oxidation with an electrically insulating layer 3, which in this case consists of a first oxide layer having a homogeneous thickness of, for example, 100 nm. By means of known techniques, a first silicon layer 4 having a thickness of about 450 nm is deposited on this insulating layer 3. This can be effected from the gaseous phase in different ways by decomposition of gaseous silicon compounds, such as, for example, $SiH_4$. Subsequently, strip-shaped first electrodes 4A,4B,4C etc. having a width of about 3 μm or slightly smaller are formed from this silicon layer 4 (cf. FIG. 1) in known manner by photolithographic etching. These first electrodes are generally rendered good conducting by doping, for example, with phosphorus, in this embodiment up to a concentration of $3 \times 10^{20}$ phosphorus atoms per $cm^3$. This doping takes place by diffusion or ion implantation, preferably before patterning the layer 4.

Figure 2:
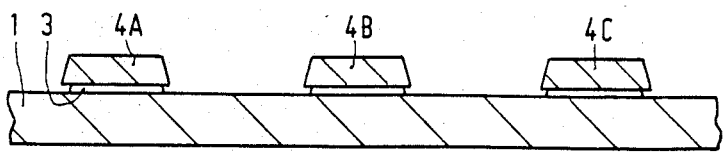
Figure 3:
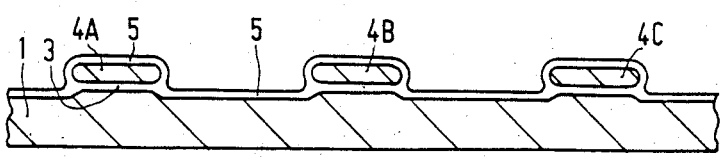
Figure 4:
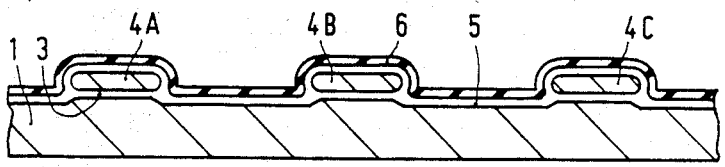
Figure 5:
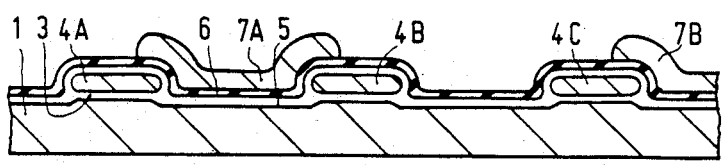

The exposed parts of the insulating oxide layer 3 not located under the first electrodes 4A,B etc. are now removed by etching (cf. FIG. 2).

Subsequently, a first thermal oxidation is carried out at 1000° C. in moist oxygen for 8 minutes. An oxide layer 5 is formed on the first electrodes 4 and on the exposed silicon region 1 (cf. FIG. 3), which oxide layer is about 80 nm thick on the monocrystalline region 1 and is about 150 nm thick on the polycrystalline silicon electrodes 4A,4B,4C. This oxidation cannot be freely chosen since the oxide layer 5 forms part of the dielectric layer under the second electrodes yet to be provided, which dielectric layer must ultimately obtain the same dielectric thickness as that of the oxide layer 3 under the first electrodes.

Subsequently, the entire structure is covered with an electrically insulating anti-oxidation layer 6. In this embodiment, this layer is an about 40 nm thick silicon nitride layer, which is preferably formed from a gaseous phase comprising a mixture of silane ($SiH_4$) and ammonia ($NH_3$) at reduced pressure and at a temperature of about 800° C.

A second silicon layer 7 is then deposited having a thickness of about 450 nm, which layer is also doped with, for example, $3 \times 10^{20}$ atoms per $cm^3$. The silicon layer is then etched into a pattern comprising a number of strip-shaped second electrodes 7A,7B etc. (cf. FIG. 5), which except for the electrodes at the ends), are each located between two "first" electrodes and overlap them in part. The overall dielectric thickness of the insulating material under the "first" electrodes 4 (oxide layer 3) and under the "second" electrodes 7 (oxide layer 5 plus nitride layer 6) is then practically the same. According to the invention, at least two first electrodes 4B,4C are located between two adjacent second electrodes 7A,7B (cf. FIG. 5).

Figure 6:
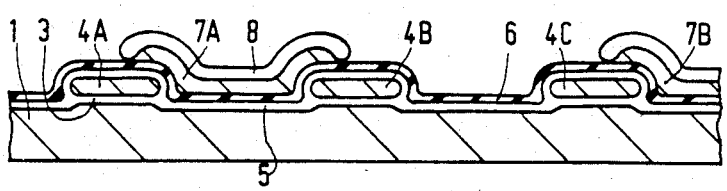

Subsequently, a second thermal oxidation is carried out for forming a third oxide layer 8 on the second electrodes 7 (cf. FIG. 6). The thickness of this oxide layer 8 can be freely chosen and in this embodiment amounts to about 300 nm. The thickness of the oxide layers 3 and 5 remains practically unchanged because these layers are located under the silicon nitride layer 6. This second thermal oxidation may be effected, for example, in moist oxygen at 1000° C. for 35 minutes.

Figure 7:
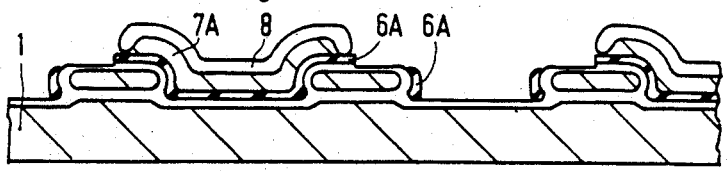
Figure 8:
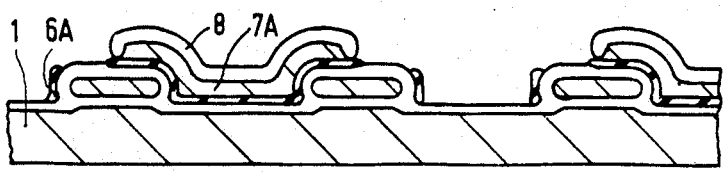

Subsequently, an anisotropic etching process is carried out in which the exposed part of the silicon nitride layer 6, except for the parts 6A thereof located on the edge of the first electrodes 4 and under projecting parts of the second and third oxide layers 5 and 8, as well as a small part of the second and third oxide layers 5 and 8, are removed (cf. FIG. 7). The plasma etching process is effected, for example, in a $CCl_4$ plasma in a planar plasma reactor at a pressure of about 0.011 kPa (80 mTorr). As a result, a preferential etching of horizontal surfaces is achieved.

A third thermal oxidation is then carried out in order to ensure that the exposed parts of the second oxide layer 5, which have reached a thickness of about 70 nm by plasma etching, are brought to a thickness of about 100 nm so that they obtain the same di-electric thickness as that under the first electrodes 4 and under the second electrodes 7. During this oxidation, the parts of the silicon nitride layer 6 located under the projecting parts of the third oxide layer 8, and not removed during plasma etching, are pressed against the oxide 8. As a result, the lateral insulation thickness at the foot of the second electrodes 7, which can be determinative of the insulation between the second and third electrodes, and which had become very small due to the rounding-off at the edge of the oxide layer 8 (cf. FIG. 7), is enlarged to practically the thickness of the oxide layer 8 (cf. FIG. 8). This is an important additional advantage of the re-oxidation of the oxide layer 5.

Subsequently, a third silicon layer 9 is provided having a thickness of, for example, about 400 nm and having, for example, the same doping as that of the first and second silicon layers 4 and 7. Finally, a number of strip-shaped third electrodes 9A,9B are formed from this third silicon layer, which third electrodes are generally located, except at the ends, each between two first electrodes (4B,4C) and overlap these electrodes, at least one third electrode 9A also overlapping a second electrode 7A (cf. FIGS. 9 and 10).

Finally, in general, the entire electrode structure will be covered for protection with a pyrolytically applied silicon oxide layer 10.

By means of the method according to the invention, in which only one silicon nitride layer is used, the oxide 5 which is not to be freely chosen on the first electrodes 4 is strengthened by the nitride layer 6 disposed on it, which nitride layer has a favourable influence on the insulation, while moreover strengthening by the nitride layer occurs at the edge of the first electrodes 4 and any cavities present in situ are automatically filled. Furthermore, the thickness of the oxide layer 8 on the second electrodes 7 can be freely chosen during the second thermal oxidation due to the presence of the nitride layer 6.

Simultaneously with the electrodes, further wiring parts, such as connection conductors and interconnections, can be formed from each of the silicon layers.

It is not necessary that all "third" electrodes overlap the "second" electrodes. See FIG. 9, in which the "third" electrode 9A overlaps the "second" electrode 7A but the "third" electrode 9B does not overlap the "second electrodes 7A and 7B. Especially when the width of the first electrodes 4A,B etc. is very small (<2-3 μm), it will be inevitable that the third electrodes overlap the second electrodes at most of the areas with the method according to the invention guaranteeing a good insulation between the third and second electrodes.

Furthermore, by means of the method according to the invention, devices other than charge-coupled devices may also be manufactured, such as, for example, integrated circuits with three-layer wiring in more general form, in which event the same threshold voltage under each of the three wiring levels is desirable.

Many variations are possible within the scope of the invention. The conductivity types and doping concentrations of the silicon layers mentioned in the embodiment and of the subjacent silicon region may be varied within wide limits, just like the thicknesses of the silicon layers, of the oxide layers and of the nitride layer. The doping of the silicon layers may be carried out, instead of after their deposition, also simultaneously with this deposition, by adding dopants to the gas mixture.

What is claimed is:
1. A method of manufacturing a semiconductor device with mutually insulated strip-shaped silicon electrodes overlapping each other, said method comprising the steps of
   a. providing on a silicon region an electrically insulating layer of a first oxide having a homogeneous thickness,
   b. forming a first silicon layer on said insulating layer,
   c. patterning said first silicon layer in a plurality of strip-shaped first electrodes by etching,
   d. removing exposed parts of said insulating layer,
   e. forming a second oxide layer on said first electrodes and on exposed parts of said silicon region by a first thermal oxidation,
   f. covering the entire surface with an electrically insulating anti-oxidation layer, said first oxide layer having an overall dielectric thickness substantially equal to the thickness of a combined second oxide layer and said anti-oxidation layer,
   g. depositing a second silicon layer,
   h. patterning said second silicon layer in a plurality of strip-shaped second electrodes by etching, wherein each second electrode is located in alternate spaces between the said first electrodes, said second electrodes partially overlapping said first electrodes between, and partially overlapping, alternate pairs of said first electrodes,
   i. forming a third oxide layer on said second electrodes by thermal oxidation,
   j. removing by anisotropic plasma etching exposed parts of said anti-oxidation layer and exposed parts of said second and third oxide layers except for parts of said anti-oxidation layer located (1) on oxidized edges of said first electrodes, and (2) under projecting parts of said second and third oxide layers,
   k. carrying out a third thermal oxidation to increase the dielectric thickness of exposed parts of said second oxide layer to practically the same value as the dielectric thickness under said first and second electrodes,
   l. providing a third silicon layer, and
   m. patterning said third silicon layer in a plurality of strip-shaped third electrodes, each third electrode being located between, and partially overlapping, two first electrodes, and wherein at least one third electrode also overlaps a second electrode.

2. A method according to claim 1, wherein said first electrodes each have a width of at most 3 μm.

3. A method according to claim 1 or claim 2, wherein said insulating layer entirely consists of silicon oxide.

4. A method according to claim 1 or claim 2, wherein said anti-oxidation layer is silicon nitride, said silicon nitride being deposited from the gaseous phase at reduced pressure.

5. A method according to claim 1 or claim 2, wherein wiring parts for said first, second and third electrodes are formed from respective silicon layers.

6. A method according to claim 1 or claim 2, wherein said silicon layers are doped before forming said plurality of strip-shaped electrodes.

* * * * *